United States Patent
Bang et al.

[19]

[11] Patent Number: 6,047,243
[45] Date of Patent: Apr. 4, 2000

[54] METHOD FOR QUANTIFYING ULTRA-THIN DIELECTRIC RELIABILITY: TIME DEPENDENT DIELECTRIC WEAR-OUT

[75] Inventors: David Bang, Palo Alto; Qi Xiang, Santa Clara, both of Calif.

[73] Assignee: Advanced Micro Devices, Inc., Sunnyvale, Calif.

[21] Appl. No.: 08/989,079

[22] Filed: Dec. 11, 1997

[51] Int. Cl.[7] .................................................. G01R 27/02
[52] U.S. Cl. ........................... 702/58; 324/452; 324/548; 324/719; 324/754; 324/765
[58] Field of Search ....................... 702/58, 57; 324/551, 324/548, 552, 554, 452, 456, 719, 765, 754

[56] References Cited

U.S. PATENT DOCUMENTS

| | | | |
|---|---|---|---|
| 4,904,946 | 2/1990 | Hirai | 324/551 |
| 5,023,561 | 6/1991 | Hillard | 324/719 |
| 5,420,513 | 5/1995 | Kimura | 324/551 |
| 5,594,349 | 1/1997 | Kimura | 324/551 |

OTHER PUBLICATIONS

"JEDEC Standard Procedure for the Wafer–Level Testing of Thin Dielectrics," Electronic Industires Association:Engineering Department (Jul. 1992).

Suehie et. al, "Field and Temperature Acceleration of Time–Dependent Dielectric Breakdown in Intrinsic Thin $SiO_2$," IEEE/IRPS (1994).

IH–Chin Cehn et. al, "Electrical Breakdown in Thin Gate and Tunneling Oxides," IEEE Transactions on Electron Devices, vol. ED–32, No. 2, (1985).

Arnold Berman, "Time–Zero Dielectric Reliability Test By a Ramp Method," IBM General Technology Division.

BTABERT User's Manual, "Oxide Breakdown Model," BTA Technology, Inc. 1993.

"Colorless and Low Dielectric Polyimide Thin Film Technology," http://www.rti.org/technology.poly_film.html.

"Thin–Film Technology," http://newton.hanyang.ac.kr/~jh-kim/jhdocu1.html.

Colorless and Low Dielectric Polyimide Thin Film Technology http://tag~www.larc.nasa.gov/tops/tops95/exhibits/mat/mat–181–95/mat18195.html.

R.A. Coombe, "The Electrical Properties and Applications of Thin Films" Sir Isaac Pitman and Sons Ltd, pp.xi–xii & 1–97.

"Reliability Related Research on Plastic IC–Packages: A Test Chip Approach," Delft University Press, pp. 173—75 & 268–72 (1994).

*Primary Examiner*—Marc S. Hoff
*Assistant Examiner*—Hien Vo
*Attorney, Agent, or Firm*—Brinks, Hofer, Gilson & Lione

[57] ABSTRACT

An ultra-thin dielectric film is subject to a dynamic electrical bias. During a first phase, the ultra-thin dielectric film is under a high field bias generated by the application of a high voltage. The duration of the high electrical stress is dependent on the intrinsic properties of the ultra-thin dielectric material. In a second phase, the ultra-thin dielectric film is subjected to an operating field bias generated by the application of an operating voltage. The change in the field bias exposes the dielectric to a similar dynamic stress that microelectronic devices ordinarily experience. At the operating field stage, a gate current is measured and compared to a predetermined range. Once the gate current exceeds that range the test concludes. Otherwise, the test cycles between the above-mentioned phases for a predetermined number of iterations based on prior experimental correlation. In a destructive testing mode, the process is continuous and does not conclude until the gate current exceeds a predetermined range. The ultra-thin dielectric gate current may also be measured as the ultra-thin dielectric is heated so that the transport properties or reliability of the ultra-thin dielectric is more clearly understood.

23 Claims, 3 Drawing Sheets

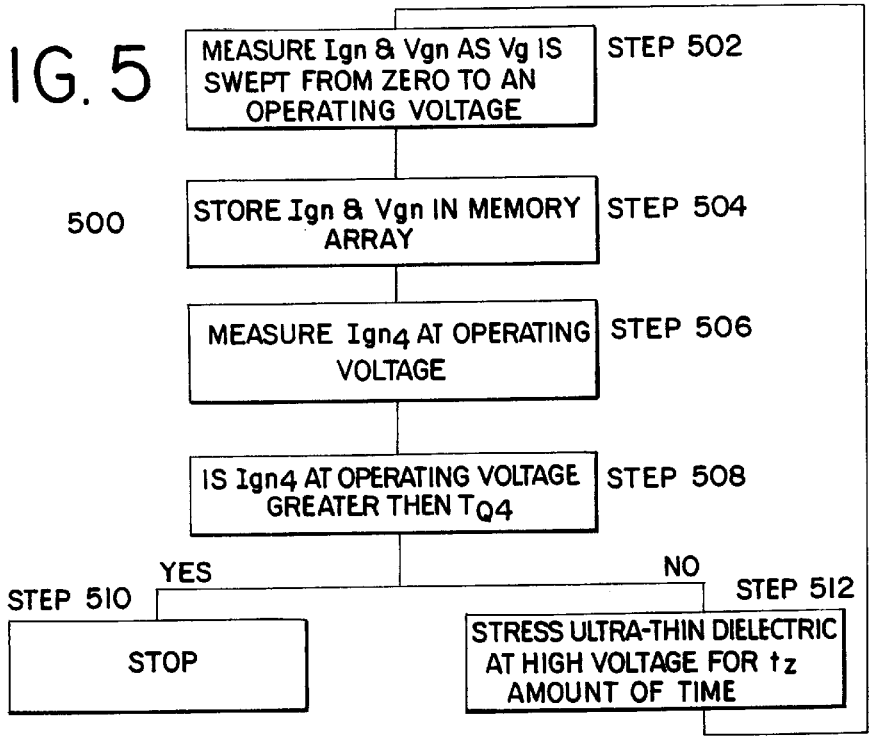
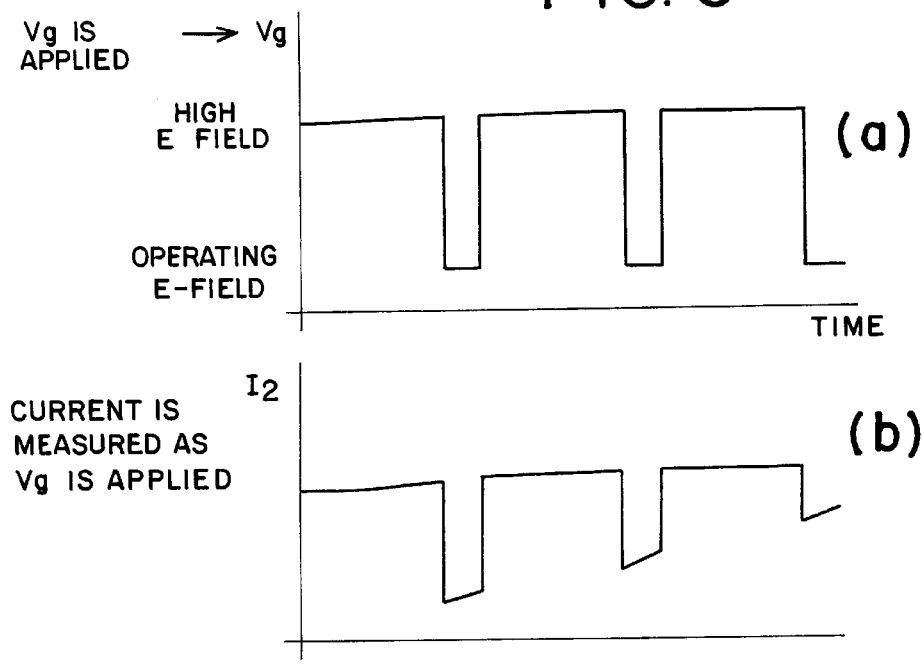

METHOD FOR QUANTIFYING ULTRA-THIN DIELECTRIC RELIABILITY: TIME DEPENDENT DIELECTRIC WEAR-OUT

BACKGROUND OF THE INVENTION

1. Technical Field of the Invention

The present invention relates to the reliability of ultra-thin dielectric films, such as mica, silicon dioxide, or Teflon, in semiconductor processing, and, in particular, relates to an ultra-thin dielectric process that tests the intrinsic properties of highly thin dielectric films at their operating field bias.

2. Description of Related Art

Ultra-thin dielectric films have been used extensively as insulating layers and protective barriers in microelectronic circuits. Conventional micro-electronic circuits are made of substrates, conductive bands, and highly thin dielectric materials. The reliability of ultra-thin dielectric affects the overall reliability of microelectronic circuits. Because an ultra-thin dielectric failure can result in catastrophic circuit failures, there exists a need to provide a reliable ultra-thin dielectric testing device and process that are capable of predicting the reliability of ultra-thin dielectrics in a cost-effective manner. In this regard, there also exists a need for a system and process that tracks the characteristics of dielectric breakdown and maintains meaningful quantitative data that can define statistical time-to-breakdown ($t_{bd}$) distributions.

For ultra-thin dielectric films to be manufactured and applied in an efficient process, a practical and relatively simple process or device is essential. The performance and yield of semiconductor applications could be improved if the mechanics and control of ultra-thin dielectric testing processes could quantify ultra-thin dielectric lifetime within the electrical fields the ultra-thin dielectrics actually experience.

A number of theories of dielectric breakdown exists. Although the theories rely on different assumptions, two classes of breakdown are described by most theories. Ultra-thin dielectric breakdown may occur as a result of voids, stacking faults, precipitates, and scratches in the ultra-thin dielectric film or may occur as a result of intrinsic variations within the ultra-thin dielectric film. It is known that field breakdown induced by electrical stress is an intrinsic property of ultra-thin dielectrics. The study of intrinsic breakdown of ultra-thin dielectric films has made clear that a process or device that tests ultra-thin dielectric electrical properties is a reliable tool for estimating yields and predicting mortality rates of microelectronic circuits.

In conventional dielectric breakdown, the degradation of an ultra-thin dielectric film occurs in two stages. In the first stage, the ultra-thin dielectric is damaged by injecting electrons under a high field bias. Breakdown may be slow to occur as the decline of an ultra-thin dielectric is dependent on the magnitude of the applied field. During the second stage, the dielectric is subjected to a substantial tunneling conduction current that usually results in thermal breakdown due to the heating effects of the current flow. Although tunneling current flow may lead to thermal breakdown, it is known that ultra-thin dielectrics may withstand these currents and therefore a tunneling current condition may be a reversible phenomenon prior to the incidence of breakdown.

From a reliability approach, neither degradation stage is an accurate predictor of ultra-thin dielectric dependability. Although $t_{bd}$ distributions may be constructed by observing these processes, at best the life-cycle approximation is subject to error as conventional dielectrics are subjected to dynamic stress over their useful lives just as microelectronic devices experience a time-varying bias during ordinary use. Moreover, a dielectric decline due to detrimental exposure to an electric field is best approximated by subjecting the dielectric to an operating electric field for a period of time as a testing process should take into account the normal operating parameters the ultra-thin dielectric will be subjected to. This complex dynamic has not been recognized in the conventional art.

In one type of conventional ultra-thin dielectric testing process, the dielectric is subjected to a linearly ramping dc stress (voltage-ramp test). The voltage-ramp test begins at a use condition voltage or lower and linearly ramps until the ultra-thin dielectric is destroyed. Because the penetration of electrons through an ultra-thin dielectric film is approximately proportional to the ultra-thin dielectric film field, the voltage ramp-test may identify the failure point of an ultra-thin film that fails at relatively low applied fields, as the starting point of this process is at a use condition or lower voltage. However, the voltage-ramp test process fails to account for the dynamic stress dielectrics are subjected to as variations in electric fields may be random and do not normally occur in linear patterns. Moreover, the voltage-ramp test commonly fails to provide a segregation of dielectrics that fail at higher electric fields known to occur during the transient operation of microelectronic circuits.

In a second type of conventional ultra-thin dielectric testing process, the dielectric is subjected to a constant high electrical stress. The breakdown process consists of applying a static dc stress at a high voltage for the duration of the process. This process identifies dielectric breakdown when a sudden runaway current exceeds a predetermined threshold. Because ultra-thin dielectrics can sustain high conduction currents for a long time, this process generally fails to clearly indicate when breakdown occurs.

In a third type of conventional ultra-thin dielectric testing process, the dielectric is subjected to an exponentially ramping current stress (current-ramp test). In this process, a current is injected into a dielectric at a relatively low value and is then ramped exponentially until a breakdown occurs. In this process, the test begins at a higher electrical bias then the voltage-ramp test so that a measurable quantity of tunneling current is produced. Current injection occurs under a high voltage bias that usually induces a greater electrical field than the operating field the dielectric would normally be subjected to. Furthermore, it is known that the current-ramp test is generally limited in predicting ultra-thin dielectric reliability subjected to low electrical field bias.

In light of the strengths and weaknesses of the above processes, the conventional art teaches the selection and application of one test based on the predicted mortality rate of a sample. If it is assumed that defects generated under a low field bias will represent a small number of some larger population of defects, the conventional art suggests that the dielectric under test be subjected to a high field bias. However, the failure of ultra-thin dielectrics is a dynamic process in which a weakest-link characteristic will depend on the stress condition. Additionally, current measurements made at high biases do not clearly show when breakdown occurs. To this end, the role of an electrical field testing process should be carefully considered, as a lack of precision in emulating the use or operating condition can be harmful to the integrity of a microelectronic circuit.

The escalating requirements in microelectronic circuits, for example, sample/hold circuits and precision analog to digital converters besides many other circuits require an ultra-thin dielectric testing process that improves microelectronic reliability, provides more accurate $t_{bd}$ statistical distributions, emulates the life-time operating conditions ultra-thin dielectrics are subjected to, simplifies the fabrication processes, applies to zero defect tolerance environments, and is cost-effective.

SUMMARY OF THE INVENTION

A process and device that is capable of measuring the degradation and breakdown of ultra-thin dielectrics is disclosed. The process and device combine multiple testing criteria to improve reliability assessments of ultra-thin dielectric films. The present disclosure is not limited to a specific dielectric material even though dielectric materials vary widely in their susceptibility to breakdown. The disclosure describes an application of a dynamic stress. During a first phase, an ultra-thin dielectric is under a high field bias generated by the application of a high voltage. The duration of the high electrical stress is dependent on the intrinsic properties of the ultra-thin dielectric material. In a second phase, the ultra-thin dielectric is subjected to an operating field bias generated by the application of an operating voltage. The change in the field bias exposes the dielectric to a similar dynamic stress that microelectronic devices ordinarily experience. At the operating field stage, a gate current is measured and compared to a predetermined range. Once the gate current exceeds that range, the test concludes. Otherwise, the test cycles between the above-mentioned phases for a predetermined number of iterations based on prior experimental correlation. In a destructive testing mode, the process is continuous and does not conclude until the gate current exceeds a predetermined range. It should be noted that the ultra-thin dielectric gate current may also be measured as the ultra-thin dielectric is heated so that the transport properties or reliability of the ultra-thin dielectric is more clearly understood.

BRIEF DESCRIPTION OF THE DRAWINGS

FIG. 5 is a flow chart of a fourth embodiment of the ultra-thin dielectric testing process.

FIG. 6(a) is a graph showing time versus applied voltage measured during the ultra-thin dielectric process of FIG. 4.

FIG. 6(b) is a graph showing time versus gate current measured during the ultra-thin dielectric process of FIG. 4.

DETAILED DESCRIPTION OF THE PRESENTLY PREFERRED EMBODIMENTS

Figure 1:
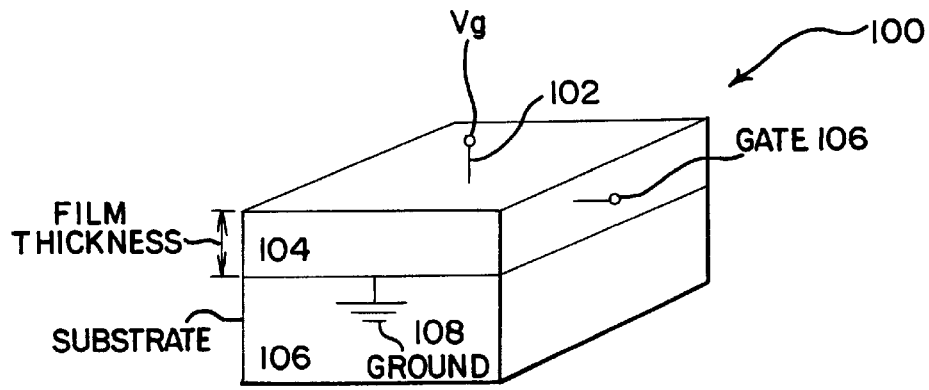
FIG. 1 is a cross-sectional view of an ultra-thin dielectric film supported by a substrate.

In the drawings, depicted elements are not necessarily drawn to scale and alike and similar elements may be designated by the same reference numeral through several views.

FIG. 1. shows a cross sectional view of an ultra-thin dielectric in accordance with a first embodiment of the invention. As shown, an electrode 102 is disposed on a planar surface area of an ultra-thin film oxide 104, which in turn is disposed on a semiconductor substrate 106 coupled to an electrical ground 108. A gate electrode 106 is disposed on a gate surface of the ultra-thin film oxide. Because good ohmic contact should be achieved through out an electrical field cycling, the selection of the electrode material will depend on the ultra-thin dielectric characteristics.

In accordance with the first embodiment, a process cycles a fluctuating electrical field bias across the ultra-thin dielectric film. The process employs a variable power source to induce a range of electrical fields from relatively low to high electrical fields. The net effect of the process is to induce an operating condition that would predict the reliability of the ultra-thin dielectric film in response to a measured gate current.

The reference to "ultra-thin dielectric films" as used in this specification refers to a very thin layer of dielectric materials that may cover thickness down to monomolecular layers. In accord with the first embodiment, thicknesses are of the order of twenty Ångstrom units. In alternative embodiments, thicknesses may be below twenty Ångstrom units.

Figure 2:
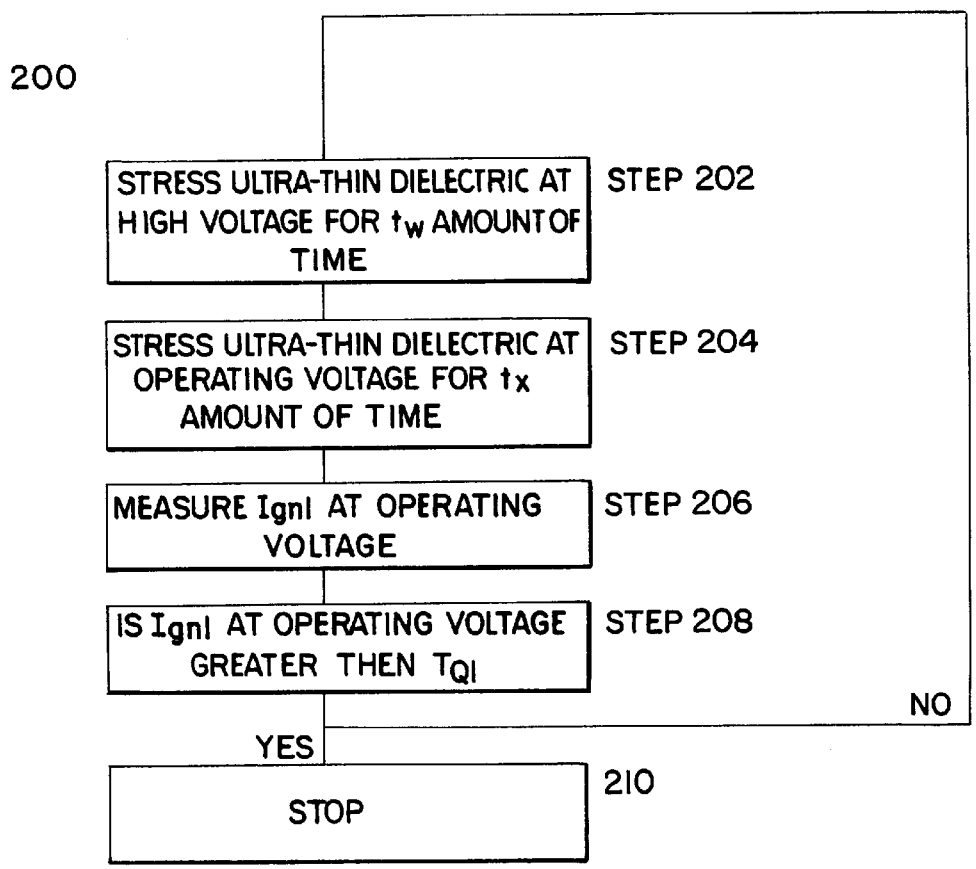
FIG. 2 is a flow chart of a first embodiment of the ultra-thin dielectric testing process.

FIG. 2. Illustrates the successive process steps for evaluating an ultra-thin dielectric in accordance with the first embodiment. An ultra-thin dielectric 104 is positioned to a specific test point. A pair of electrodes are thereafter coupled to the ultra-thin dielectric film such that the anode electrode 102 is electrically coupled to a top planar surface of the film and the cathode electrode 108 is electrically coupled to the corresponding substrate 106 that supports the ultra-thin dielectric film 104. The electrodes are electrically connected to a variable programmable dc power supply. The power supply is of sufficient current and voltage compliance such that the ultra-thin dielectric film may experience catastrophic failure or breakdown. The ultra thin dielectric is subjected to an electrical stress by alternatively applying a high positive electrical voltage for a variable amount of time ($t_w$) (step 202) and then applying an operating positive electrical voltage for a variable amount of time ($t_x$) (step 204). Using a plurality of electrical conductors (e.g. a pair of probes), the ultra-thin dielectric gate current ($I_{gn1}$) is periodically sampled at the operating electrical field bias (step 206), stored in a memory array, and recorded on a print-out. The gate current is then compared to a first predetermined quality threshold value ($T_{Q1}$) (step 208). When $I_{gn1}$ is greater than $T_{Q1}$, the test concludes (step 210). However, when $I_{gn1}$ is less than or equal to $T_{Q1}$ the process is repeated for a predetermined number of iterations ($N_1$). According to this embodiment, the number of iterations is based on prior experimental correlation that depend on the properties of the ultra-thin dielectric under test. In a destructive testing mode, the process continuously subjects the ultra-thin dielectric to the electrical stress during which $I_{gn1}$ is recorded after different stress time intervals (steps 202–208). The test concludes when $I_{gn1}$ is greater than $T_{Q1}$ (step 210). It should be noted that the ultra-thin dielectric may also be subjected to a thermal stress during the testing process by heating the ultra-thin dielectric. A further variation of the embodiment subjects the ultra-thin dielectric to a negative bias effectively switching the polarities of the electrodes.

Figure 3:
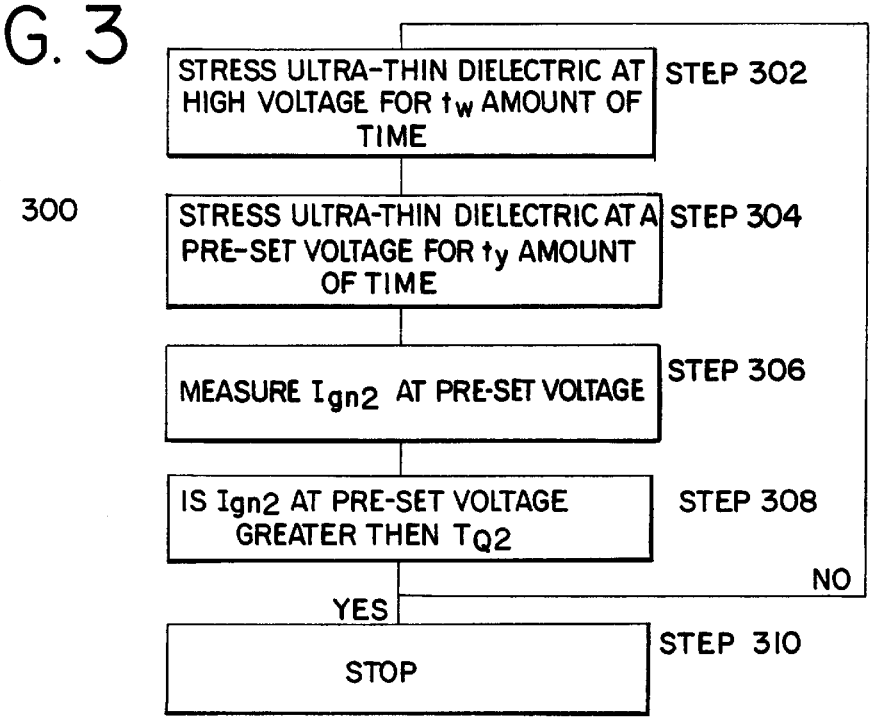
FIG. 3 is a flow chart of a second embodiment of the ultra-thin dielectric testing process.

FIG. 3 shows a second embodiment wherein an ultra-thin dielectric is subjected to a high and variable field bias. In this configuration, the ultra thin dielectric is subjected to electrical stress by alternatively applying a high electrical voltage for a variable amount of time ($t_w$) (step 302) before applying a variable electrical voltage for a variable amount of time ($t_y$) (step 304). When $I_{gn2}$ is greater than a second predetermined quality threshold $T_{Q2}$, the test concludes (step 310). However, when $I_{gn2}$ is less than or equal to $T_{Q2}$ the process is repeated for a second predetermined number of iterations ($N_2$). Further processing steps in this embodiment are identical to the first embodiment and therefore are not repeated.

Figure 4:
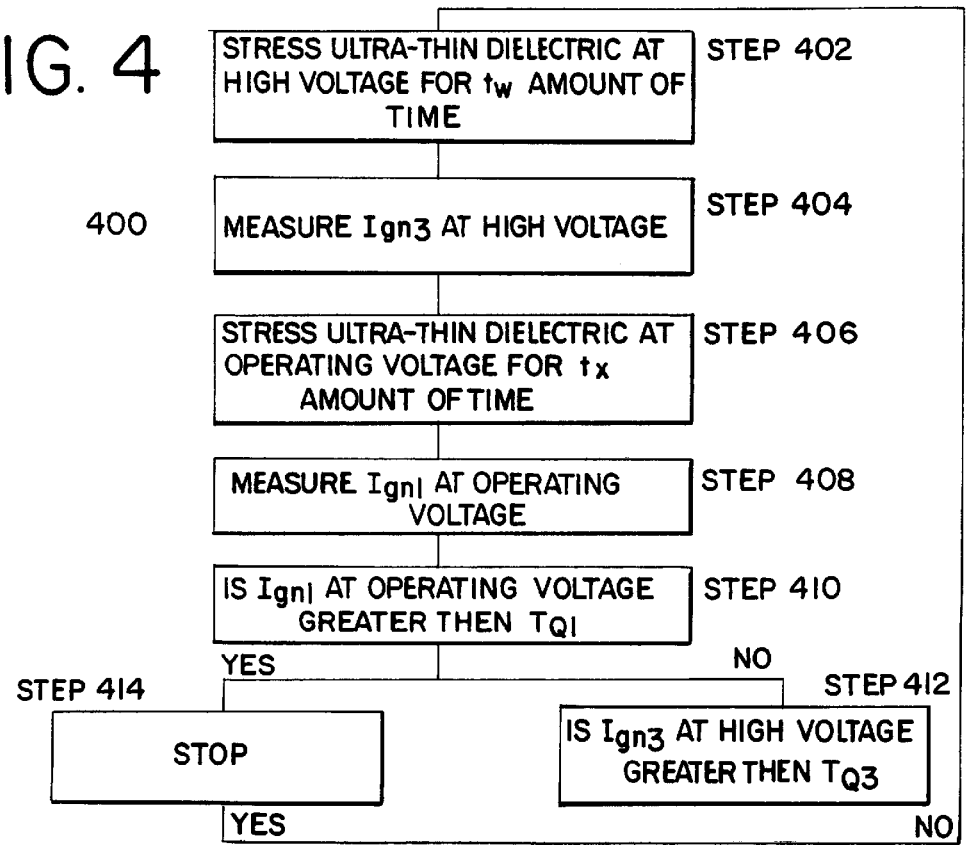
FIG. 4 is a flow chart of a third embodiment of the ultra-thin dielectric testing process.

The embodiment depicted in FIG. 4 is also similar to that depicted in FIG. 1, but further comprises the steps of sampling a gate current ($I_{gn3}$) at a high voltage (step 404) and comparing the sampled gate current to a third predetermined quality threshold $T_{Q3}$ (step 412). Thus, FIG. 4 constitutes a further improvement of the embodiment shown in FIG. I by evaluating an additional reliability criteria, $I_{gn3}$, for the purpose of projecting the ultra-thin dielectric useful life under extended transient voltage conditions.

In another embodiment, the ultra-thin dielectric sweeps a variable electrical bias. In accordance with a fourth embodiment, illustrated as FIG. 5, the ultra-thin dielectric gate current ($I_{gn}$) and applied voltage ($V_{gn}$) is systematically measured as the ultra-thin dielectric is subjected to a sweeping electrical bias (step 502). $I_{gn}$ and $V_{gn}$ data is then measured and recorded in a memory array (step 504). As illustrated in FIG. 5., a gate current ($I_{gn4}$) is then measured at the operating voltage (step 506). When $I_{gn4}$ is greater than $T_{Q4}$, the test concludes (step 510). When $I_{gn4}$ is less than or equal to $T_{Q4}$, the ultra-thin dielectric is stressed at a high voltage for a predetermined amount of time, $t_z$, (step 512) before repeating the process for a third pre-determined number of iterations ($N_3$). In this embodiment, the quality threshold, $T_{Q4}$, for a 20 Å thick silicon dioxide film is approximately 1 Amp/cm$^2$. Like the prior two embodiments, further processing steps in this embodiment are identical to the first embodiment and therefore are not repeated.

The illustrations of the various embodiments can also employ further testing strategies. These embodiments may include the further processing steps of pre-screening the ultra-thin dielectric by applying a conventional breakdown evaluation process before implementing one of the principal processes. Because these further processing steps are conventional, they are not repeated. Likewise, the principal processing steps disclosed herein may be combined with other steps readily apparent to those skilled in the art.

The positive electrical bias applied to the ultra-thin dielectric and corresponding gate current measured is graphically illustrated in FIGS. 6(a) and 6(b). FIG. 6(a) shows a periodic dc bias that induces a high and operating electrical field. In this illustration, the ultra-thin dielectric is subjected to a simulated square voltage waveform having a duty cycle defined by its predetermined testing periods ($t_w$ and $t_x$). FIG. 6(b) shows corresponding gate currents ($I_{gn1}$ and $I_{gn3}$) measured at the operating and high electrical fields respectively after the resistive and capacitive transients of the ultra-thin dielectric film expired. The gate current measurements illustrate an increasing $I_{gn}$ trend corresponding to an increasing stress time.

The concepts and processes previously illustrated may be implemented through software or logic circuitry. The aforementioned embodiments were employed using an HP 4156. A silicon dioxide ultra thin dielectric having a thickness on the order of twenty Angstrom units was evaluated. Using the HP 4156, subroutines that stressed and sampled the gate current between a low and high operating fields were employed. The smart electronics of this device provided all electrical connections and hardware logic between the silicon dioxide sample, a sample positioning device, the programmable power supply, and a current measuring device.

In accordance with the disclosed embodiments, the performance capabilities and reliability characteristic of an ultra-thin dielectric testing process are disclosed by evaluating the ultra-thin dielectric integrity at an operating field bias. The disclosed embodiments provide an improved ultra-thin dielectric testing process that improves microelectronic reliability, provides more accurate $t_{bd}$ statistical distributions, emulates the life-time operating conditions ultra-thin dielectrics are subjected to, simplifies the fabrication processes, applies to zero defect tolerance environments, and is cost-effective. The disclosed embodiments enjoy utility in any ultra-thin dielectric fabrication or total quality manufacturing environment. The ultra-thin dielectric testing device, for example, may be interfaced to a device that classifies and segregates ultra-thin dielectric films, an output display, and a device for marking ultra-thin dielectrics that fail test criteria.

Those skilled in the art will implement the steps necessary to provide the device and methods disclosed herein and understand the process parameters including $t_w$, $t_x$, $t_y$, $t_z$, $T_{Q1}$, $T_{Q2}$, $T_{Q3}$, $T_{Q4}$, $N_1$, $N_2$, and $N_3$, will vary according to the intrinsic and extrinsic properties of the ultra thin dielectric under test.

Variations and modifications of the embodiments disclosed herein may be made without departing from scope and spirit of the invention. The aforementioned description is intended to be illustrative rather than limiting and it is understood that the scope of the invention is set forth by the following claims.

We claim:

1. An ultra-thin dielectric testing system for monitoring and detecting intrinsic breakdowns in ultra-thin dielectric substrates, comprising:

power source means for imparting a high electrical bias and an operating electrical bias to an ultra-thin dielectric;

measuring means, coupled to said substrate, for measuring a leakage current after said power source means switches from said high electrical bias to said operating bias;

comparison means, coupled to said measuring means, for comparing said measured leakage current to a predetermined range; and determination means, coupled to said comparison means, for classifying the projected reliability of said substrate based on said comparison.

2. The ultra-thin dielectric testing system as defined in claim 1, wherein said power source means imparts a high electrical bias for a predetermined period of time.

3. The ultra-thin dielectric testing system as defined in claim 1, wherein said power source means imparts an operating electrical bias for a predetermined period of time.

4. The ultra-thin dielectric testing system as defined in claim 1, wherein said ultra-thin dielectric has a thickness below twenty Ångstrom units.

5. An apparatus for monitoring and process control of ultra-thin dielectric substrates, comprising:

a memory device, a power source for imparting an electrical potential across an ultra-thin dielectric substrate by electrically connecting a pair of electrodes across said ultra-thin dielectric; and a testing circuit capable of evaluating the integrity of said ultra-thin dielectric by electrically activating said power source to a high potential for a predetermined period of time before applying an operating potential for a predetermined period of time, and then measuring a gate leakage current at said operating potential and storing said measurement in said memory device.

6. The apparatus for monitoring and process control of ultra-thin dielectric substrates as defined in claim 5, wherein said power source is programmable and responsive to said test circuit.

7. The apparatus for monitoring and process control of ultra-thin dielectric substrates of claim 5, wherein said predetermined periods of time are programmable periods of time.

8. For use in an ultra-thin dielectric testing process having a first probe and a second probe for measuring a leakage current, such ultra-thin dielectric having a thickness below twenty Angstrom units being subject to thermal breakdown caused by heating effects of conduction current and intrinsic breakdown caused by adverse energy increases of free electron flow, comprising:

a power supply having a pair of electrodes electrically connected to an ultra-thin dielectric having a thickness below twenty Angstrom units for providing a first high electric field and a second operating electric field;

a current measuring device, coupled to said ultra-thin dielectric by a pair of probes, for measuring a gate leakage current at said operating electric field;

a comparison device, coupled to said current measuring device, for comparing said leakage current measurement to a predetermined range so as to predict the reliability of said ultra-thin dielectric; and a memory device for storing said current measurement.

9. The ultra-thin dielectric testing device defined in claim 8, wherein said power supply provides a first high electric field for a programmable period of time.

10. The ultra-thin dielectric testing device defined in claim 8, wherein said predetermined range is determined by a function of a sampling of a gate current at a range of voltages and wherein separation of said pair of current measuring probes is a function of a plurality of intrinsic properties of said ultra-thin dielectric.

11. The ultra-thin dielectric testing device defined in claim 8, wherein said selection means is associated with an identification device for marking said ultra-thin dielectric that has a gate leakage current greater than said predetermined range.

12. The ultra-thin dielectric testing device defined in claim 8, wherein said power supply sweeps between said high electric field and said operating electric field.

13. A destructive test circuit device for continuously sampling the breakdown strength of an ultra-thin dielectric, comprising:

a sensing device conductively connected to an ultra-thin dielectric having a thickness below twenty Ångstrom units, said sensing device capable of measuring a gate leakage current;

a testing circuit coupled to said sensing device and being capable of imparting a high electrical field across said ultra-thin dielectric for a period of time before imparting an operating electrical field across said ultra-thin dielectric for a period of time, wherein said testing circuit continuously cycles said electrical field and periodically compares a sample of said leakage current measured at said operating electrical field to a predetermined range during each cycle to predict the reliability of said ultra-thin dielectric.

14. The destructive test circuit device defined in claim 13, wherein said testing circuit tests said ultra-thin dielectric for a predetermined number of cycles.

15. The test circuit device defined in claim 13, wherein said predetermined range is a function of a plurality of previously sampled gate currents measured at a predetermined voltage.

16. The test circuit device defined in claim 13, wherein said testing circuit further compares a second sample of said leakage current measured at said high electrical field to a second predetermined range during each cycle.

17. A process for determining the reliability of an ultra-thin dielectric comprising the steps of:

electrically coupling an ultra-thin dielectric to a pair of electrodes electrically coupled to a power source;

applying a high electric field across said ultra-thin dielectric for a period of time;

applying an operating electric field across said ultra-thin dielectric after said period of time has passed;

measuring gate leakage current flow at said operating electric field;

comparing said gate leakage current measurement to a predetermined range; and then determining whether dielectric breakdown will occur.

18. The process of claim 17, wherein said process further comprises moving said ultra-thin dielectric substrate to a specific test point.

19. The process of claim 17, wherein said process further includes storing said measured gate leakage current flow and storing said comparison.

20. The process of claim 17, wherein said process is an iterative destructive process that continuously cycles until said ultra-thin dielectric is destroyed.

21. A method comprising the steps of:

providing a test-circuit capable of applying a first high electrical bias across an ultra-thin dielectric for a programmable period of time before applying a second operating bias across said ultra-thin dielectric for a programmable period of time; and then sensing the difference between an induced gate current flow at said operating bias and a predetermined range to project a reliability of said ultra-thin dielectric.

22. A system for testing ultra-thin dielectric materials comprising:

a sensing device conductively connected to an ultra-thin dielectric having a thickness below twenty Angstrom units, said sensing device capable of measuring a gate leakage current;

a testing circuit coupled to said sensing device and being capable of imparting a high electrical field across said ultra-thin dielectric for a period of time before imparting an operating electrical field across said ultra-thin dielectric for a period of time, wherein said testing circuit compares a sample of said gate leakage current measured at said operating electrical field to a predetermined range.

23. An ultra-thin dielectric testing system for monitoring and detecting intrinsic breakdowns in ultra-thin dielectric substrates, comprising:

power source means for imparting a high electrical bias and an operating electrical bias to an ultra-thin dielectric;

measuring means, coupled to said substrate, for measuring a leakage current after said power source means switches from said high electrical bias to said operating bias;

comparison means, coupled to said measuring means, for comparing said measured leakage current to a predetermined range;

memory means, coupled to said comparison means, for storing said measured leakage current; and determination means, coupled to said comparison means, for classifying the projected reliability to said substrate based on said comparison.

\* \* \* \* \*